(12) United States Patent
Sargeant et al.

(10) Patent No.: US 7,799,399 B2
(45) Date of Patent: Sep. 21, 2010

(54) HIGH BARRIER LAMINATE AND PROCESS

(75) Inventors: Steven Sargeant, Kingston, RI (US);
Gianfranco Chicarella, North Providence, RI (US); John Medeiros, Portsmouth, RI (US); Joseph Anthony Bourgeault, Minnetonka, MN (US); Todd Richard Sarnstrom, Ellsworth, WI (US); Paul Andrew Ansolabehere, Minnetonka, MN (US); Todd Fayne, Plano, TX (US)

(73) Assignee: Toray Plastics (America), Inc., North Kingstown, RI (US)

( * ) Notice: Subject to any disclaimer, the term of this patent is extended or adjusted under 35 U.S.C. 154(b) by 0 days.

(21) Appl. No.: 11/651,103

(22) Filed: Jan. 9, 2007

(65) Prior Publication Data
US 2007/0287017 A1   Dec. 13, 2007

Related U.S. Application Data

(60) Provisional application No. 60/811,410, filed on Jun. 7, 2006.

(51) Int. Cl.
| | |
|---|---|
| B32B 15/08 | (2006.01) |
| B32B 15/09 | (2006.01) |
| B32B 27/08 | (2006.01) |
| B32B 27/32 | (2006.01) |
| B32B 27/36 | (2006.01) |

(52) U.S. Cl. .................. 428/35.9; 428/35.7; 428/35.8; 428/36.6; 428/36.7; 428/195.1; 428/200; 428/209; 428/212; 428/343; 428/347; 428/349; 428/355 EN; 428/457; 428/458; 428/480; 428/483; 428/523; 446/220

(58) Field of Classification Search .................. None
See application file for complete search history.

(56) References Cited

U.S. PATENT DOCUMENTS

| | | | | |
|---|---|---|---|---|
| 4,011,358 A | * | 3/1977 | Roelofs | 428/516 |
| 4,077,588 A | * | 3/1978 | Hurst | 244/31 |
| 4,290,763 A | | 9/1981 | Hurst | |
| 4,322,003 A | * | 3/1982 | Long | 206/525 |
| 4,375,494 A | * | 3/1983 | Stokes | 428/323 |
| 4,636,442 A | | 1/1987 | Beavers et al. | |

(Continued)

FOREIGN PATENT DOCUMENTS

JP        07-268189     * 10/1995

(Continued)

OTHER PUBLICATIONS

International Search Report and Written Opinion, dated Oct. 26, 2007, directed to corresponding International Application No. PCT/US07/13164.

*Primary Examiner*—Vivian Chen
(74) *Attorney, Agent, or Firm*—Morrison & Foerster LLP

(57) ABSTRACT

A process for fabricating a high barrier lamination suitable for the construction of lighter than air materials including providing a thin, two layer thermoplastic film consisting of an amorphous copolyester skin and a high crystalline polyester core; plasma treating the high crystalline polyester core layer to a surface energy of about 50 to about 68 dyne; depositing a metal barrier layer to an optical density of about 2.2 to about 3.2; and extrusion coating a linear low density polyethylene sealant layer on the amorphous copolyester skin layer.

12 Claims, 1 Drawing Sheet

U.S. PATENT DOCUMENTS

| | | | |
|---|---|---|---|
| 4,704,325 A * | 11/1987 | Crocker | 428/323 |
| 4,778,431 A | 10/1988 | Dudley | |
| 4,917,646 A | 4/1990 | Kieves | |
| 5,108,339 A | 4/1992 | Kieves | |
| 5,164,248 A * | 11/1992 | Fleury et al. | 428/220 |
| 5,209,972 A * | 5/1993 | Super et al. | 428/349 |
| 5,338,243 A | 8/1994 | Kieves | |
| 5,458,965 A * | 10/1995 | Yoshinaka et al. | 428/323 |
| 5,713,777 A | 2/1998 | Greenwald | |
| 5,853,862 A * | 12/1998 | Murai et al. | 428/215 |
| 5,882,747 A | 3/1999 | Bria et al. | |
| 5,942,320 A * | 8/1999 | Miyake et al. | 428/216 |
| 5,958,552 A * | 9/1999 | Fukuda et al. | 428/141 |
| 6,103,368 A * | 8/2000 | Fukuda et al. | 428/337 |
| 6,194,054 B1 * | 2/2001 | Peiffer et al. | 428/141 |
| 6,214,440 B1 * | 4/2001 | Peiffer et al. | 428/141 |
| 6,221,191 B1 * | 4/2001 | Davis et al. | 156/150 |
| 6,291,053 B1 * | 9/2001 | Peiffer et al. | 428/141 |
| 6,391,410 B1 * | 5/2002 | Peiffer et al. | 428/35.7 |
| 6,436,544 B1 * | 8/2002 | Veyrat et al. | 428/458 |
| 6,543,208 B1 * | 4/2003 | Kobayashi et al. | 53/452 |
| 6,607,815 B2 * | 8/2003 | Bartsch et al. | 428/216 |
| 6,743,512 B2 * | 6/2004 | Murata et al. | 428/423.1 |
| 6,803,113 B2 | 10/2004 | Porter et al. | |
| 7,115,320 B2 * | 10/2006 | Tanaka et al. | 428/458 |
| 2002/0094396 A1 * | 7/2002 | Ward et al. | 428/35.3 |
| 2009/0022919 A1 * | 1/2009 | Chicarella et al. | 428/35.9 |

FOREIGN PATENT DOCUMENTS

| | | | |
|---|---|---|---|
| WO | WO 2004/016417 | * | 2/2004 |

\* cited by examiner

HIGH BARRIER LAMINATE AND PROCESS

CROSS-REFERENCE TO RELATED APPLICATION

This application claims the benefit of U.S. Provisional Application Ser. No. 60/811,410 filed Jun. 7, 2006.

FIELD OF THE INVENTION

This invention is related to high barrier laminations. These laminations are suitable for constructing lighter than air materials (Structures).

BACKGROUND OF THE INVENTION

Gas barrier properties refer to the ability of materials to prevent the ingress or egress of gases from a structure. Well known examples of common barrier materials are, for instance, glass bottles and aluminum cans meant to contain food or beverages. The function of the barrier material, besides containing the product, is to prevent the ingress of oxygen which would lead to food spoilage. Additionally, these barrier materials prevent the egress of gases from the container which would lead to product degradation or taste and feel issues for the consumer. For instance, in the case of beverages, the egress of $CO_2$ is limited by the use of proper barrier materials, therefore it is possible to maintain carbonation in beverages.

Rigid materials are often used when barrier properties are desired. However, when weight constraints are an issue, flexible thin thermoplastic films and relatively brittle metal foils can be utilized, as is well known in the art. Well known examples of flexible films or foil composite structures used as barrier materials are that of foil laminations made to produce retortable pouches. The function of the foil is to prevent the ingress of oxygen into the package and prevent food spoilage issues. Thus in a flexible package, aluminum foil is serving the same essential barrier function as that of glass or steel in traditional can and bottle packaging structures.

In the case of lighter than air products, such as, for instance, balloons, promotional items, toys, and the like, the use of rigid materials like glass and steel and metal foils is not practical due to weight issues and cost considerations. Therefore, it is well known in the art to utilize metallized thermoplastic films, including, for example, metallized nylon films or metallized PET (polyethyleneterephthalate) films to serve as the barrier material. However, such thin films are known to have stress cracking issues related to the metal barrier surfaces that often result in increased permeation of lighter than air gases like helium, the gas typically used for inflating the materials. Therefore, the use of traditional metallized nylon and PET films in the construction of lighter than air structures has been for the production of materials with a limited lifetime after inflation with the low density gas.

Therefore, there is a need for the cost effective utilization of thermoplastic films with decreased permeation rates to function as long life barrier materials in the construction of lighter than air products.

U.S. Pat. No. 4,077,588, the disclosure of which is totally incorporated by reference herein, describes in the Abstract thereof a substantially permanently buoyant balloon suitable for use as a toy or in advertising. For example, a balloon is provided which includes an envelope containing a lighter than air gas such as helium. The envelope is made from attached panels of a non-elastomeric polymer sheet material carrying a continuous metal layer on at least one side thereof. The metal layer can either be a thin metal film contiguously bonded to the polymer, or can be metal which is vapor deposited over the surface of the polymer. The balloon itself is constructed so that the ratio of its volume taken to the two-thirds power divided by its surface area is in the range of form about 0.21 to about 0.01, and the weight of the envelope can range form about $2.6 \times 10^{-4}$ $gm/cm^2$ to about $1.7 \times 10^{-2}$ $gm/cm^2$. The envelope is preferably manufactured in a two dimensional "lay-flat" form in any desired two dimensional shape unlike conventional balloon envelopes which are inherently three dimensional surfaces. Balloon envelopes having the above described volume to surface area ratio and made with the above described composite panel material will be maintained buoyant for an indefinite period of time when filled with the lighter than air gas.

U.S. Pat. No. 5,338,243, the disclosure of which is totally incorporated by reference herein, describes in the Abstract thereof a balloon product, including at least two sheets, having a background depiction on one sheet and a foreground depiction on the other. The foreground depiction has a complementary relationship to the background depiction so as to provide a three-dimensional animated image.

U.S. Pat. No. 5,713,777, the disclosure of which is totally incorporated by reference herein, describes in the Abstract thereof a non-latex inflatable toy in the form of a hand puppet. The puppet includes three sheets defining an inflatable chamber and a pocket for the hand of the user.

U.S. Pat. No. 5,882,747, the disclosure of which is totally incorporated by reference herein, describes in the Abstract thereof a lighter than air balloon constructed from a flexible film material which has coated one or more of its interior or exterior surfaces thereon a barrier material which is not a pure metal and which has an oxygen transmission rate of less than 0.5 $cm^3/100$ $in^2/24$ hr. at 75° F., 65% relative humidity, said balloon being able to float when inflated with a lighter than air gas and a process for producing the balloon is provided. Further of interest include U.S. Pat. Nos. 4,290,763; 4,778, 431; 4,917,646; and 5,108,339; the disclosures of each of which are totally incorporated by reference herein.

The appropriate components and process aspects of the each of the foregoing U.S. Patents may be selected for the present disclosure in embodiments thereof.

SUMMARY OF THE INVENTION

The present disclosure is generally related to films and more particularly relates in embodiments to films and processes for producing films, for example, in embodiments, thermoplastic films, for example polyethyleneterephthalate (PET) films, having high barrier properties whereby the barrier properties are maintained through in various exemplary embodiments, film structure, treatment processes, for example plasma treatment processes used when metallizing the film. The disclosure further relates to a balloon fabrication process.

Embodiments disclosed herein include a film including a first high crystalline polyester layer; a second amorphous copolyester layer; wherein the first high crystalline polyester layer and the second amorphous polyester layer are co-extruded to form an oriented film; and a metallized layer.

In embodiments, a process for fabricating a high barrier lamination suitable for the construction of lighter than air materials is disclosed including providing a thin, two layer thermoplastic film consisting of an amorphous copolyester skin and a high crystalline polyester core; plasma treating the high crystalline polyester core layer to a surface energy of about 50 to about 68 dyne; depositing a metal barrier layer to an optical density of about 2.2 to about 3.2; and coating a linear low density polyethylene sealant layer on the amorphous copolyester skin layer. Preferably, the linear low density polyethylene sealant layer is extrusion coated.

For example, in embodiments, the process includes treating the high crystalline polyester core layer to a desired surface energy, in embodiments a high surface energy, for example a surface energy of about 65 dyne. Treating can be by any suitable means including but not limited to plasma treating, physical chemical vapor deposition, among others. In embodiments, plasma treating includes treating the high crystalline polyester core layer to a surface energy of about 65 dyne.

In embodiments, the process includes depositing the metal barrier layer by vacuum deposition. In embodiments, the metal barrier layer includes an aluminum barrier layer.

In embodiments, the aluminum barrier layer has an optical density of greater than about 2.6.

In embodiments, the process further includes coating the sealing layer including priming the skin layer and extrusion coating the sealant layer.

In embodiments, the high crystalline polyester core layer includes high intrinsic viscosity (IV) homopolyesters or copolyesters of polyethyleneterephthalate, polybutyleneterephthalate (PET/PBT) (and alike polyester copolymers).

In embodiments, the high crystalline polyester core layer includes an intrinsic viscosity of about 0.50 to about 0.60. In embodiments, the crystalline polyester core layer includes an intrinsic viscosity of greater than about 0.60.

In embodiments, the amorphous copolyester layer includes isophthalate modified copolyesters, sebacic acid modified copolyesters, diethyleneglycol modified copolyesters, triethyleneglycolmodified copolyesters, cyclohexanedimethanol modified copolyesters, and mixtures and combinations thereof.

Further disclosed in embodiments is a high barrier lamination suitable for the construction of lighter than air materials including a thin, two layer thermoplastic film consisting of an amorphous copolyester skin and a high crystalline polyester core; wherein the high crystalline polyester core layer has a surface energy of about 50 to about 68 dyne; a metal barrier layer having an optical density of about 2.2 to about 3.2; and a linear low density polyethylene sealant layer on the amorphous copolyester skin layer.

DETAILED DESCRIPTION OF THE INVENTION

Figure 1:
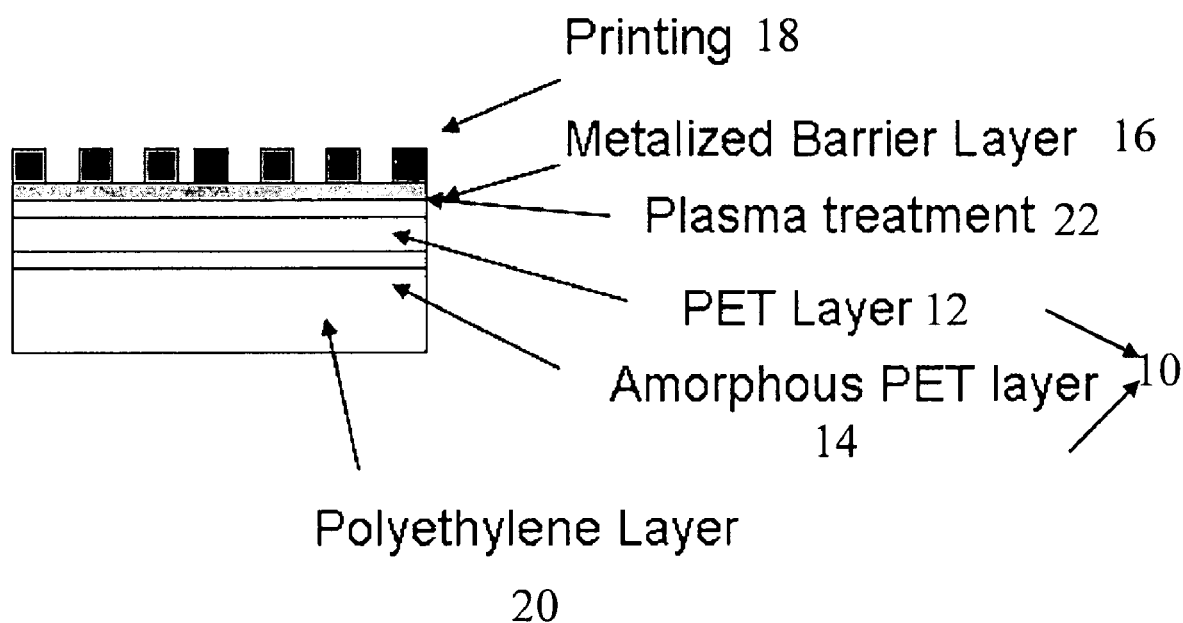
FIG. 1 is a cross-sectional view of a film in accordance with one possible embodiment of the present disclosure.

In embodiments, a method to produce a thermoplastic PET film is disclosed, having, in embodiments, enhanced gas barrier properties. Further disclosed are subsequent lamination processes which produce a final structure having long life time characteristics when compared to traditional structures.

In embodiments, a film material is disclosed including a thin, extensible, yet stress crack resistant two layer film material. In embodiments, a process for preparing a film includes preparing a film such as for example on a commercial biaxially orientation tentering film line.

In embodiments, a two layer film prepared using a plasma treatment and a metallized barrier layer is provided. In further embodiments, the film, when fabricated into a device, for example a balloon, retains all or substantially all of its barrier properties. While not wishing to be bound by theory, in embodiments, the present barrier retention characteristic is due, in embodiments to the structure of the film, a plasma treatment process used for example during metalizing, or a combination thereof.

An embodiment shown in FIG. 1 includes a film 10 including a first high crystalline polyester layer 12 and a second amorphous copolyester layer 14. Preferably, the thickness of film 10 including layers 12 and 14 is 6-12 µm. The structure in FIG. 1 also includes a linear low density polyethylene (LLDPE) layer 20.

The high crystalline polyester layer 12 can include any suitable material. For example, in embodiments, high crystalline polyester layer 12 includes high intrinsic viscosity (IV) homopolyesters or copolyester of PET/PBT, for example, in embodiments, an intrinsic viscosity (IV) >0.50 or an IV of >0.60.

Crystallinity is defined as the weight fraction of material producing a crystalline exotherm when measured using a differential scanning calorimeter. For a high crystalline polyester, an exothermic peak in the melt range of 220° C. to 290° C. is most often observed. High crystallinity is therefore defined as the ratio of the heat capacity of material melting in the range of 220° C. to 290° C. versus the total potential heat capacity for the entire material present if it were all to melt. A crystallinity value of >35% weight fraction is considered high crystallinity.

The amorphous copolyester layer 14 can include any suitable material. For example, in embodiments, amorphous copolyester layer 14 includes isophthalate modified copolyesters, sebacic acid modified copolyesters, diethyleneglycol modified copolyesters, triethyleneglycolmodified copolyesters, cyclohexanedimethanol modified copolyesters.

A metallized barrier layer 16 is disposed over all or a part of the high crystalline layer 12. Deposition of the barrier layer is done via a low pressure vacuum metalizing process of aluminum. Before deposition of the aluminum layer in the vacuum chamber, a plasma treatment process 22 is preferably used to clean and functionalize the high crystallinity polyester surface layer. The plasma treatment is adjusted to give a surface energy of the high crystalline polyester layer of approximately 65 dyne. Although not wishing to be bound by any particular theory, the inventors believe that a higher dyne level treatment is possible but would degrade and weaken the high crystalline surface layer. This degradation would reduce the metal adhesion of the vacuum deposited aluminum and thus would not be of optimal commercial value. Likewise, a plasma treatment process can be utilized to functionalize the high crystalline polyester film surface to a lower treatment level, or no treatment can be utilized. However, lower treatments give lower aluminum bonds and thus reduce the commercial utility of the process. In embodiments, the metallization may be applied to the amorphous layer if desired.

In embodiments, the film may be processed into any desired configuration. For example, printing 18 may be disposed upon metallized layer 16.

The materials selected for the various layers can include any suitable material. For example, in embodiments, the polyester I and polyester II of the first high crystalline layer are essentially the same. In further embodiments, the polyester I and polyester II of the first high crystalline layer are the same or different and are independently selected from the group consisting of polyethylene terephthalate polybutylene terephthalate, polypropylene terephthalate, polyethylenenapthalate, mixtures, copolymers and combinations thereof.

Further, in embodiments, the polyester I and polyester II of the second amorphous layer are the same or different and are independently selected from the group consisting of polyethylene terephthalate, polybutylene terephthalate, polypropylene terephthalate, polyethylenenapthalate, mixtures, copolymers and combinations thereof.

The films herein can have any suitable thickness as desired. Each layer can be selected at a suitable thickness as desired for the particular application. In embodiments, the film has a total film thickness of from about 4.5 μm to about 12 μm.

The following Examples are being submitted to further define various species of the present disclosure. These Examples are intended to be illustrative only and are not intended to limit the scope of the present disclosure. Also, parts and percentages are by weight unless otherwise indicated.

EXAMPLES

Crystalline PET Preparation

A polyester base film was prepared as follows: Polyethylene terephthalate A can be polymerized by a known method. For example, a melt slurry of ethylene glycol and purified terephthalic acid was heated, in the presence of an esterification catalyst, and water and excess ethylene glycol was removed under vacuum leaving a residual melt of polyester. This melt was discharged via strand die into a cooling trough, pelletized, and then further dried to remove residual moisture to less than about 50 ppm. Trimethylphosphate of 0.032 wt %, magnesium acetate of 0.060 wt %, antimony trioxide of 0.026 wt %, and tetraethyl ammonium hydroxide of 0.252 wt %, were also used to prepare polyester A. External particles were not added to polyester A.

Polyethylene terephthalate B was polymerized by a known method. A melt slurry of ethylenegylcol and purified terephthalic acid was heated, in the presence of an esterification catalyst, and water and excess ethylene glycol were removed under vacuum leaving a residual melt of polyester. This melt was discharged via strand die into a cooling trough, pelletized, and then further dried to remove residual moisture to less than about 50 ppm. Lithium acetate dihydrate of 0.226%, trimethylphosphate of 0.181 wt %, phosphorous acid of 0.020 wt %, antimony trioxide of 0.04 wt %, and calcium acetate of 0.119 wt %, were used to prepare a polyester B.

Particles (A) being $SiO_2$ particles of an average particle size of about 2.6 μm (micrometers), were admixed into polyethylene terephthalate co-polymerized by a known method: A melt slurry of ethylenegylcol and purified terephthalic acid was heated, in the presence of an esterification catalyst, and water and excess ethylene glycol were removed under vacuum leaving a residual melt of polyester. This melt was discharged via strand die into a cooling trough, pelletized, and then further dried to remove residual moisture to less than about 50 ppm. Tetraethyl ammonium hydroxide of 0.049 wt %, lithium acetate dihydrate of 0.882 wt %, antimony trioxide of 0.039 wt %, and calcium acetate of 0.090 wt %, and trimethylphosphate of 0.042 wt % were also used to prepare polyester C. The content of particles (A) in the polyester pellet (C) was 2.0%.

Next, 48.5 parts by weight of polyester pellets (A), 48.5 parts by weight of polyester pellets (B), and 3.0 parts by weight of polyester pellets (C), were mixed. The mixed pellets were extruded using a vent type two-screw extruder to produce melt stream (I). Next, 48.5 parts by weight of pellets (A), 48.5 parts by weight of pellets (B), and 3.0 parts by weight of pellets (C), were mixed. Up to about 55% recycle consisting of finished film can replace equal parts of polymer A and polymer B.

An amorphous co-extruded surface layer for the polyester thermoplastic film was prepared as follows. An isophthalic acid co-terephthalic acid random co-polyester co-polymer with an IV of about 0.65 and a mol ratio of about 18% isophthalic acid and 82% terephthalic acid, commercially available from Invista as 8906™, was co-extruded on a base sheet of polyethyleneterephthalate. The base sheet of polyethyleneterephthalate can be prepared as described above for the core layer. Alternatively, a co-polyester consisting of a random co-polymer of cyclohexane dimethanol residues, commercially available from Eastman Chemical, with an IV of about 0.70 can be utilized as the amorphous layer. The thickness of the amorphous layer was set to about 0.5 μm.

The high crystalline PET layer and amorphous layer were extruded, combined in a feedblock assembly and cast on a cooling drum. Subsequently the two layer structure was oriented in the machine direction using a heated roller train and was then oriented in the cross machine, or TD, direction using a chain driven tenter frame. At the end of the tenter frame the film was heated to lock in the crystallization properties and to enhance the overall mechanical strength of the film.

The film was then metallized to an optical density of between 2.6 to about 3.0. In the metalizing chamber a plasma treatment process was used to prepare the surface for the metal deposition. The utilization of the plasma treatment produces very high metal adhesion and it is believed also increases the surface energy of the resultant metal surface. It is believed that both attributes are desired in combination in order to give commercial utility to the disclosed products/devices.

In addition to plasma treatment processing other surface treatment methods may be employed in the vacuum system. Included in the alternative methods are copper seeding, nickel seeding or other sputtering treatment methodologies.

The total thickness of the film is selected as desired. Typical end use conditions range from about 4.5 μm to about 12 μm, typically from about 5 μm to about 10 μm, particularly when used, for example, for balloon type applications.

Testing Methods

Oxygen barrier was measured on a MOCON Ox-Tran L series device utilizing ASTM D3985. Testing conditions used were 73° F., 0% relative humidity, and 1 ATM. For this type of measurement, the metallized surface of the web is protected with a Stamark lamination. The lamination protects the metal surface from handling damage, but makes no significant contribution to the oxygen barrier. The inventors believe that oxygen barrier measurement is directly correlated to helium barrier properties.

Metal adhesion was measured by heat-sealing of an Dow PRIMACOR 3300 film to the metal surface on a Sentinel heat sealer. Heat seal conditions are 220° F. temperature, 20 seconds dwell time, and 40 psi jaw pressure, 1 heated jaw. Prior to peeling the sealed materials are cut so that each web can be gripped in a separate jaw of the tensile tester and 1"×1" section of sealed material can be peeled. The peel is initiated by hand and then the two webs are pealed apart on a Shimadzu tensile tester in a 180° configuration toward the EAA. If the metal is separated from the substrate and remains attached to the EAA then the mean force of the peel is reported as the metal bond strength. If the metallized web is destroyed the bond is reported as destructive metal bond strength.

The material was processed by several operations to produce a finished balloon. These processes were, in the following order, 1.) extrusion coating of a linear low density polyethylene (LLDPE) onto the non-metallized surface of the metallized film, 2.) flexographic printing of graphic designs on the metallized surface of the metallized web, 3.) slitting of the subsequent printed web, 4.) Fabrication of balloons by die-cutting and heat sealing process, 5.) Folding and packaging of the finished balloons.

The extrusion coating is accomplished in any suitable fashion. For example, extrusion coating can be accomplished generally as follows. The extrusion equipment used in this process is desirably set up in a manner that will prevent scratching; scuffing or abrading the metallized surface. The metallized film is coated on the non-metallized surface with a primer coating using a forward gravure process with enclosed applicator. The primer was dried in a flotation convective dryer. The dried primer surface was then used as an anchor for an extrusion coating of LLDPE through known methods. Furthermore the use of a barrier primer, such as a PVOH, EVOH primer or the inclusion of EVOH in a sealant layer may be utilized should even higher barriers be desired.

The bond of the LLDPE to the substrate is tested by inserting a slip sheet into the extruded web between the substrate and the LLDPE. A standard bond test is then conducted in methods known to those in the art with minimum values of 0.425 kgf and an optimal value equal or greater than 0.500 kgf when separation speed of 6" per minute is used in the test. The seal strength is tested for LLDPE to LLDPE seal. A one inch test sample is tested with methods known to those in the art with a minimum value of 3.625 kgf and an optimal value of equal or greater than 4.50 kgf when a separation speed of 6" per minute is used.

Flexographic printing description: The printing equipment used in this process must be set up in a manner that will prevent scratching; scuffing or abrading the metallized surface. The extrusion coated film is printed on the metal surface with up to 10 colors of ink, using a flexographic printing press. Each color receives some drying prior to application of the subsequent color. After print application the inks are fully dried in a roller convective oven to remove all solvents from the ink.

Slitting is accomplished in any suitable fashion, for example, slitting can be accomplished as follows. The slitting equipment used in this process is desirably set up in a manner that will prevent scratching; scuffing or abrading the metallized surface. The printed web is cut to lengths adequate for the balloon fabrication process by rewinding on a center driven rewinder/slitter using lay-on nip rolls to control air entrapment of the rewound roll.

Balloon fabrication can be accomplished in any suitable fashion. The fabrication equipment used in this process is desirably set up in a manner that will prevent scratching; scuffing or abrading the metallized surface. The slit webs are fabricated into balloons by aligning 2 or more webs into position so that the printed graphics are properly registered to each other, then are adhered to each other and cut into shapes using methods known to those in the art. A seam thickness of 1/64" to 1/2" has been found to have greater resistance to defects with an optimal seam being 1/16" to 1/8". If desired a valve can be inserted into an opening and the layers abutting the valve adhered to form a complete structure. The use of a valve is considered optional.

Folding is accomplished in any suitable fashion. The folding equipment used in this process is desirably set up in a manner that will prevent scratching; scuffing or abrading the metallized surface. The fabricated balloons are mechanically folded along multiple axis's using many different mechanical process or by hand. The balloon can be folded to the proper size mechanically and mechanically or by hand be loaded into a pouch. The balloon can also be hand folded along multiple axis's with care taken not to scratch, scuff or abrade the metallized surface. The hand folded balloon can also be inserted into a pouch by hand or mechanically.

Barrier results are shown in Table 1. The film described herein in embodiments maintains excellent barrier properties after processing into balloon shapes, etc. and inflated. Comparatively, materials prepared from Nylon film show a significant degradation of barrier after being processed and inflated.

Example 1

An 36 Ga polyester laminated film was prepared from a blend of high crystalline polyester resin laminated to a layer of non-crystalline copolyester tentered to a final stretch ratio of about 3.8×3.8. The film was subsequently plasma treated and vacuum metallized with aluminum to an optical density of about 2.8. Oxygen barrier measurements were made on the top of the roll and at the bottom of the roll materials. Excellent barrier at the top and bottom of the roll was determined, showing good roll uniformity in the process. Furthermore, the film was processed into a final balloon form and the progress of the materials were recorded via a barrier measurement. As shown in Table 1, the balloon fabrication process did not change the barrier properties of the film significantly through the entire process showing excellent stress crack resistance of the materials.

Comparative Example A

A 40 Ga metallized nylon sample was processed through the same balloon converting steps. Before the converting process, the barrier was measured of the thin gauge metallized nylon web. After final fabrication, the barrier of the structure was also measured as shown in Table 1. Also shown in Table 1 are the actual hang times that the balloon fabricated from the film retained its original shape, form and firmness.

TABLE 1

| $O_2$ TR Barrier Testing (73° F., 0% RH) | | |
|---|---|---|
| Sample Description | cc/100 sqin/day | Hang time in days |
| Example #1-Roll surface | .02-.06 | |
| Example #1-Bottom of roll | .02-.06 | |
| Example #1-Extrusion Coated Roll#1 | .04-.09 | |
| Example #1-Printed Roll#1 (ink area) | .04-.09 | |
| Example #1-Printed Roll#1 (clear area) | .04-.09 | |
| Example #1-Slit and Printed process | .04-.09 | |
| Balloon Fabrication Roll#1 | .04-.09 | 21+ |
| Folded and Packaged Balloon Finished Roll#1 | .04-.09 | 21+ |
| Comparative Example-Metallized Nylon | .05-.09 | |
| Comparative Example After Balloon Fabrication | .05-.09 | 4-7 |
| Comparative example-after folding and insertion into package | .06-.22 | 2-7 |

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

This application discloses several numerical ranges in the text and figures. The numerical ranges disclosed are intended to support any range or value within the disclosed numerical ranges even though a precise range limitation is not stated verbatim in the specification because this invention can be practiced throughout the disclosed numerical ranges. It is also to be understood that all numerical values and ranges set forth in this application are necessarily approximate.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

The invention claimed is:

1. A balloon formed from a lamination, the lamination comprising:
    a two layer polyester film consisting of an amorphous copolyester skin with a thickness of about 0.5 μm, and a biaxially oriented polyester core;
    wherein the total thickness of the polyester film is about 36 gauge, and the biaxially oriented polyester core layer has a surface energy of about 50 to about 68 dyne;
    a metal barrier layer having an optical density of about 2.2 to about 3.2 on the biaxially oriented polyester core layer;
    a graphic design printed onto the metalized surface; and
    a linear low density polyethylene sealant layer on the amorphous copolyester skin layer, wherein the balloon has an oxygen transmission rate of 0.04 to 0.09 cc/100 sqin/day after folding and packaging, and the balloon contains a lighter than air gas.

2. The balloon of claim 1, wherein the biaxially oriented polyester core layer has a surface energy of about 65 dyne.

3. The balloon of claim 1, wherein the metal barrier layer comprises an aluminum barrier layer.

4. The balloon of claim 1, wherein the metal barrier layer has an optical density of greater than about 2.6.

5. The balloon of claim 1, wherein a primer is disposed over the skin layer between the skin layer and the sealant layer.

6. The balloon of claim 1, wherein the biaxially oriented polyester core layer comprises homopolyesters or copolyesters of polyethyleneterephthalate, polybutyleneterephthalate, with an intrinsic viscosity of about 0.50 to about 0.60.

7. The balloon of claim 1, wherein the biaxially oriented polyester core layer comprises an intrinsic viscosity of about 0.50 to about 0.60.

8. The balloon of claim 1, wherein the biaxially oriented polyester core layer comprises an intrinsic viscosity of greater than about 0.60.

9. The balloon of claim 1, wherein the amorphous copolyester layer comprises isophthalate modified copolyesters, sebacic acid modified copolyesters, diethyleneglycol modified copolyesters, triethyleneglycolmodified copolyesters, cyclohexanedimethanol modified copolyesters, and mixtures and combinations thereof.

10. The balloon of claim 1, wherein the lighter than air gas comprises helium.

11. A balloon formed from a lamination, the lamination comprising:
    a two layer polyester film consisting of an amorphous copolyester skin with a thickness of about 0.5 μm, and a biaxially oriented polyester core;
    wherein the total thickness of the polyester film is about 36 gauge, and the biaxially oriented polyester core layer has a surface energy of about 50 to about 68 dyne;
    a metal barrier layer having an optical density of about 2.2 to about 3.2 on the biaxially oriented polyester core layer;
    a graphic design printed onto the metalized surface; and
    a linear low density polyethylene sealant layer on the amorphous copolyester skin layer,
    wherein the balloon has an oxygen transmission rate of 0.04 to 0.09 cc/100 sqin/day after folding and packaging, the balloon contains a lighter than air gas, and the balloon is capable of having a hang time of more than 21 days after folding and packaging.

12. The balloon of claim 11, wherein the lighter than air gas comprises helium.

* * * * *